(12) United States Patent
Nakabayashi

(10) Patent No.: US 10,141,488 B2
(45) Date of Patent: Nov. 27, 2018

(54) LIGHTING DEVICE

(71) Applicant: NICHIA CORPORATION, Anan-shi, Tokushima (JP)

(72) Inventor: Takuya Nakabayashi, Tokushima (JP)

(73) Assignee: NICHIA CORPORATION, Anan-shi (JP)

( * ) Notice: Subject to any disclaimer, the term of this patent is extended or adjusted under 35 U.S.C. 154(b) by 26 days.

(21) Appl. No.: 15/418,025

(22) Filed: Jan. 27, 2017

(65) Prior Publication Data

US 2017/0222106 A1 Aug. 3, 2017

(30) Foreign Application Priority Data

Jan. 28, 2016 (JP) ................. 2016-014021

(51) Int. Cl.
*H01L 33/58* (2010.01)
*H01L 33/62* (2010.01)
*H01L 33/54* (2010.01)
*H01L 33/50* (2010.01)
*H01L 33/60* (2010.01)

(52) U.S. Cl.
CPC ............ *H01L 33/58* (2013.01); *H01L 33/502* (2013.01); *H01L 33/54* (2013.01); *H01L 33/60* (2013.01); *H01L 33/62* (2013.01); *H01L 2933/0091* (2013.01)

(58) Field of Classification Search
CPC ............... H01L 2924/12043; H01L 31/0236–31/02366; H01L 31/055; H01L 31/0547–31/0549; H01L 31/0232–31/02327; H01L 31/054–31/056; H01L 31/0543; H01L 31/043; H01L 31/0687; H01L 31/072; H02S 50/00–50/15; H02S 40/20–40/22
See application file for complete search history.

(56) References Cited

U.S. PATENT DOCUMENTS

| 6,657,382 B2 | 12/2003 | Nagai et al. |
| 2005/0276566 A1 | 12/2005 | Iimura |
| 2008/0030986 A1 | 2/2008 | Ogawa et al. |
| 2009/0016080 A1 | 1/2009 | Ohno |
| 2009/0146171 A1 | 6/2009 | Okubo |
| 2010/0289048 A1 | 11/2010 | Kumura |
| 2013/0114299 A1 | 5/2013 | Lee et al. |

FOREIGN PATENT DOCUMENTS

| JP | 2000-004050 A | 1/2000 |
| JP | 2003-086846 A | 3/2003 |
| JP | 2005-064111 A | 3/2005 |
| JP | 2005353556 A | 12/2005 |

(Continued)

*Primary Examiner* — Julio J Maldonado
*Assistant Examiner* — Stanetta Isaac
(74) *Attorney, Agent, or Firm* — Hunton Andrews Kurth LLP

(57) ABSTRACT

A lighting device is provided. The lighting device includes a lightguide panel having an end face and a light-emitting device configured to emit light toward the end face of the lightguide panel. The light-emitting device includes a light-emitting element and a first light-transmissive member provided between the end face of the lightguide panel and the light-emitting element. The first light-transmissive member has a plurality of protrusions on a surface thereof. At least one of the plurality of protrusions is in contact with the end face of the lightguide panel.

16 Claims, 3 Drawing Sheets

(56) References Cited

FOREIGN PATENT DOCUMENTS

| | | | |
|---|---|---|---|
| JP | 2006277991 | A | 10/2006 |
| JP | 2007-005091 | A | 1/2007 |
| JP | 2008-060068 | A | 3/2008 |
| JP | 2009-141051 | A | 6/2009 |
| JP | 2010-272304 | A | 12/2010 |
| JP | 2013532312 | A | 8/2013 |
| JP | 2014225379 | A | 12/2014 |
| WO | 2009-066398 | A1 | 5/2009 |

LIGHTING DEVICE

CROSS-REFERENCE TO RELATED APPLICATION

This application claims priority to Japanese Patent Application No. 2016-014021, filed on Jan. 28, 2016, the disclosure of which is hereby incorporated by reference in its entirety.

BACKGROUND

The present disclosure relates to a lighting device.

An edge-lit backlight unit that includes a light source such as a light-emitting diode (hereinafter referred to as an "LED") and a lightguide panel, in which light emitted from the light source is incident on an end face of the lightguide panel from a panel surface of the lightguide panel has been proposed. With such a backlight unit, when the light source and the end face of the lightguide panel are apart from each other, the light input efficiency into the lightguide panel may not be optimal as described in Japanese Laid-Open Patent Publication No. 2010-272304. Therefore, the light source may be provided so as to be in contact with the end face of the lightguide panel.

SUMMARY

However, when the light-emitting area of the light source is positioned to be in contact with the end face of the lightguide panel, as compared with a case in which the light-emitting area of the light source is spaced apart from the end face of the lightguide panel, light having entered the inside of the lightguide panel may have a smaller refraction, and the light may be more likely to leak at the light-receiving edge of the lightguide panel.

In view of this, an object of one embodiment of the present disclosure is to provide a lighting device with less leaking light at the light-receiving edge of the lightguide panel even when the light-emitting area of the light source is positioned to be in contact with the end face of the lightguide panel.

A lighting device according to an embodiment of the present disclosure includes a lightguide panel having an end face, and a light-emitting device configured to emit light toward the end face of the lightguide panel. The light-emitting device includes a light-emitting element and a first light-transmissive member provided between the end face of the lightguide panel and the light-emitting element. The first light-transmissive member has a plurality of protrusions on a surface thereof. At least one of the plurality of protrusions is in contact with the end face of the lightguide panel.

According to an embodiment of the present disclosure, it is possible to realize a lighting device, with which even when the light-emitting area of the light source is positioned to be in contact with the end face of the lightguide panel, light is unlikely to leak at the light-receiving edge of the lightguide panel.

DETAILED DESCRIPTION

An embodiment of the present disclosure will now be described referring to the figures as necessary. Note however that the lighting device and the light-emitting device to be described below are merely an embodiment of the technical concept of the present disclosure, and the present disclosure is not limited thereto unless otherwise stated specifically. Members shown in the figures may be exaggerated in their size and positional relationship for the sake of illustration.

Figure 1A:
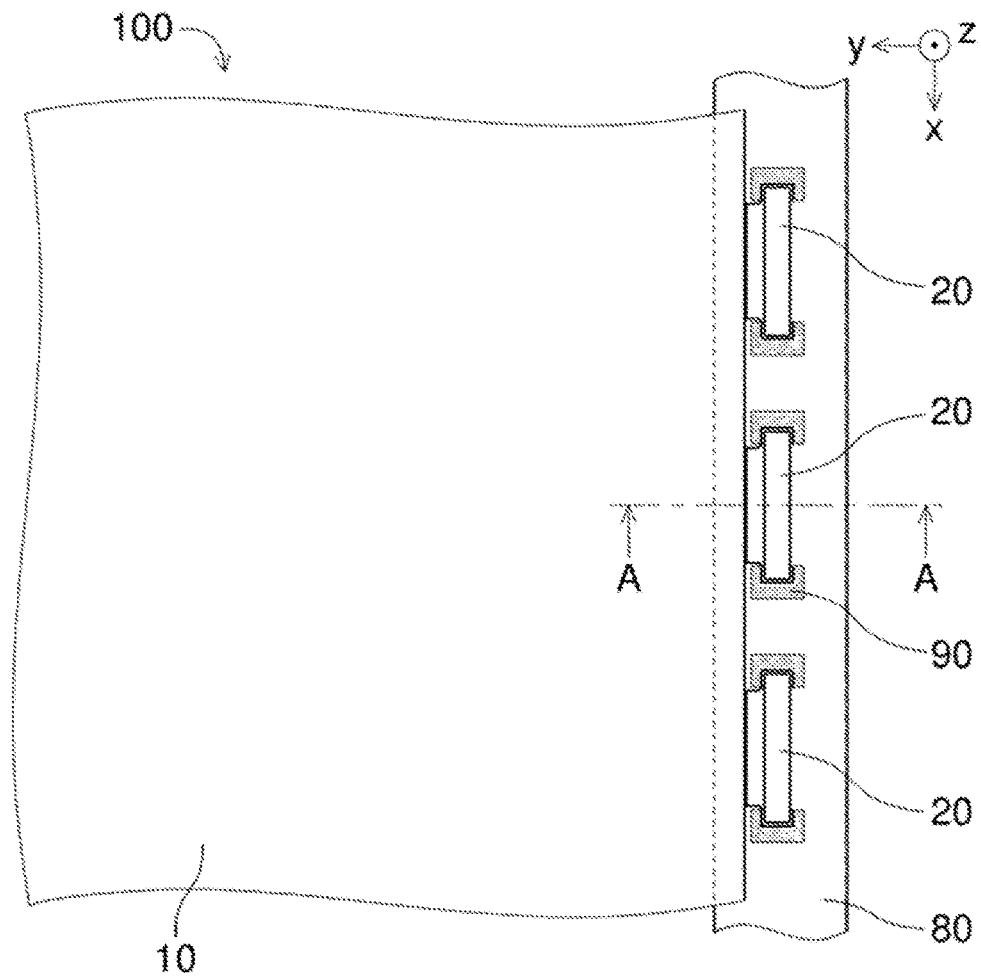
FIG. 1A is a schematic plan view of a lighting device according to an embodiment of the present disclosure.
Figure 1B:
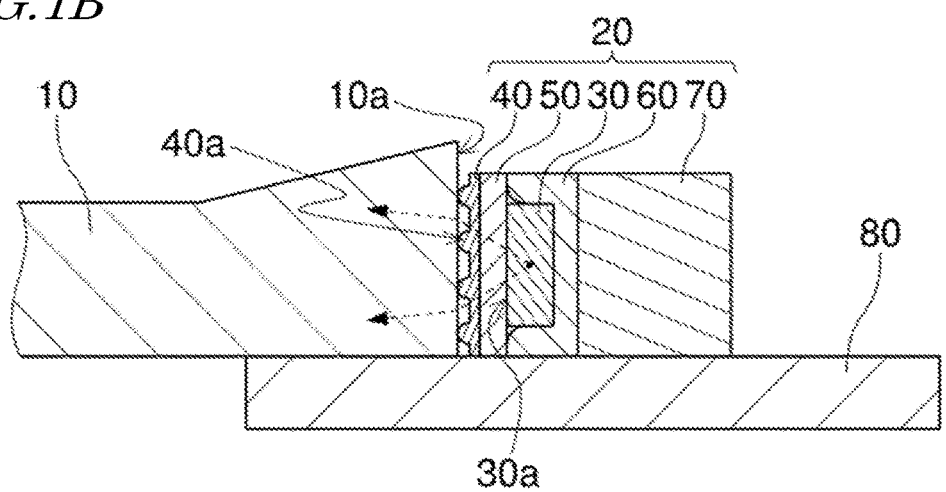
FIG. 1B is a schematic cross-sectional view thereof taken along line A-A in FIG. 1A.
Figure 2A:
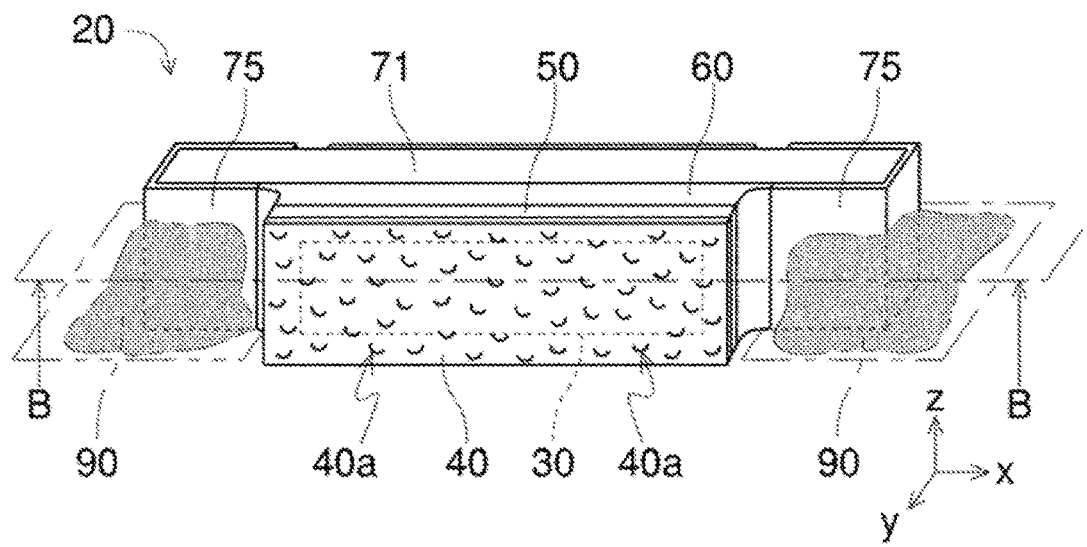
FIG. 2A is a schematic perspective view of a light-emitting device according to an embodiment of the present disclosure.
Figure 2B:
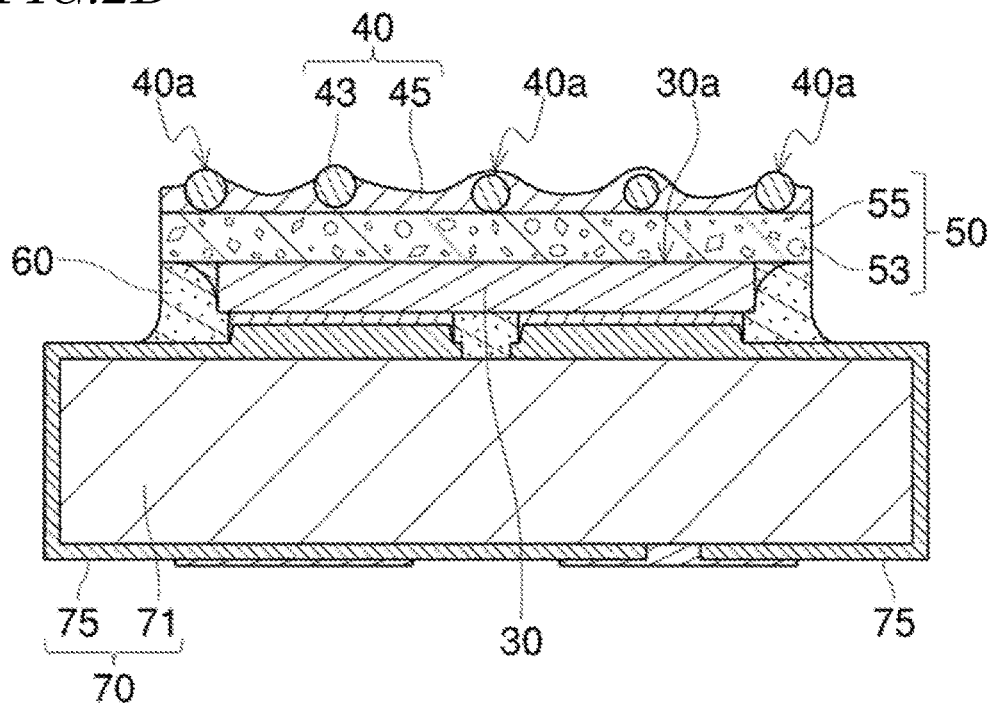
FIG. 2B is a schematic cross-sectional view thereof taken along line B-B in FIG. 2A.

FIG. 1A is a schematic plan view of a lighting device 100 according to the an embodiment of the present disclosure, and FIG. 1B is a schematic cross-sectional view thereof taken along line A-A in FIG. 1A. FIG. 2A is a schematic perspective view of a light-emitting device 20, and FIG. 2B is a schematic cross-sectional view thereof taken along line B-B in FIG. 2A.

For the lighting device 100 shown in FIG. 1A, the x direction (x axis) is the vertical direction, the y direction (y axis) the horizontal direction, and the z direction (z axis) the height direction. Referring to FIG. 2A, for the light-emitting device 20 provided in the lighting device 100, the x direction (x axis) is the longitudinal direction, the y direction (y axis) the front-back direction, and the z direction (z axis) the height direction. The optical axis of the light-emitting device 20 is assumed to be parallel to the y direction (y axis). Note that each of the x, y and z directions (x, y and z axes) is a direction (axis) that is orthogonal to the other two directions (axes).

As shown in FIGS. 1A and 1B, the lighting device 100 includes a lightguide panel 10 and a plurality of light-emitting devices 20. The lightguide panel 10 has an end face 10a. The light-emitting device 20 emits light toward the end face 10a of the lightguide panel. This light-emitting device 20 is of a side-emitting type or a "side-view type".

The light-emitting devices 20 are arranged on a circuit board 80 next to each other along the end face 10a of the lightguide panel 10 (in other words, along the x direction in FIG. 1A). Each of the light-emitting devices 20 is attached to a land portion of the circuit board 80 via a conductive attachment member 90, and is capable of emitting light by receiving power supply through a circuit of the circuit board 80.

As shown in FIGS. 2A and 2B, the light-emitting device 20 includes a light-emitting element 30 and a first light-transmissive member 40. The light-emitting element 30 has a light-emitting surface 30a. The first light-transmissive member 40 is provided between the end face 10a of the lightguide panel and the light-emitting element 30, i.e., on the light-emitting surface 30a side of the light-emitting element (on the front side along they axis in FIG. 2A). The first light-transmissive member 40 has a plurality of protrusions 40a on the surface thereof. The surface of the first light-transmissive member 40 forms the light-emitting area of the light-emitting device 20. This light-emitting device 20 further includes a wiring substrate 70. The wiring substrate 70 includes a base 71, and a pair of, that is, positive and negative, conductive wirings 75 provided on the base 71. The light-emitting element 30 is flip-chip mounted on the pair of conductive wirings 75.

As shown in FIGS. 1A and 1B, at least one of the plurality of protrusions 40a is in contact with the end face 10a of the lightguide panel.

With the lighting device 100 having such a configuration, even when the light-emitting area of the light-emitting device 20 is positioned to be in contact with the end face 10a of the lightguide panel, gaps can remain partially between the light-emitting area of the light-emitting device 20 and the end face 10a of the lightguide panel due to the presence of the protrusions 40a. That is, an interface between the end face 10a of the lightguide panel and the air is present partially between the light-emitting area of the light-emitting device 20 and the end face 10a of the lightguide panel. The refractive index difference of this interface is usually greater than the refractive index difference of the interface between the end face 10a of the lightguide panel and the light-emitting area of the light-emitting device 20. Therefore, in this area (i.e., the interface between the end face 10a of the lightguide panel and the air), light having entered the lightguide panel 10 is refracted to an equivalent degree to that when the light-emitting area of the light-emitting device 20 is spaced apart from the end face 10a of the lightguide panel. Thus, with the lighting device 100, even when the light-emitting area of the light-emitting device 20 is in contact with the end face 10a of the lightguide panel, leaking light at the light-receiving edge (in other words, the end face 10a) of the lightguide panel 10 can be reduced.

The light beams emitted from the protrusions 40a can be concentrated by refraction at the surfaces of the protrusions 40a. Moreover, portions of the surfaces of the protrusions 40a that are facing toward the optical axis (e.g., the central axis) of the light-emitting device 20 are capable of reflecting light of the light-emitting device 20 (more specifically, light beams output into the gaps between the end face 10a of the lightguide panel and the light-emitting device 20) toward the optical axis of the light-emitting device 20. These may also contribute to reducing light leakage at the light-receiving edge of the lightguide panel 10. In addition, the interface between the protrusions 40a and the end face 10a of the lightguide panel in contact with the protrusion 40a usually has a small refractive index difference, thereby a high optical coupling efficiency may be realized.

The function and the effect described above may be realized as long as each light-emitting device 20 has one protrusion 40a in contact with the end face 10a of the lightguide panel. Nevertheless, each light-emitting device 20 more preferably has a plurality of protrusions 40a, and each light-emitting device 20 even more preferably has four or more protrusions 40a. Also, the function and the effect described above may be realized as long as there is at least one light-emitting device 20 that has protrusions 40a in contact with the end face 10a of the lightguide panel. Nevertheless, it is more preferred that there are a plurality of such light-emitting devices 20, and it is even more preferred that the light-emitting devices 20 mounted on the lighting device 100 all have protrusions 40a in contact with the end face 10a of the lightguide panel. There may be only one light-emitting device 20, instead of a plurality of light-emitting devices 20, mounted on one lighting device 100.

Preferred examples of the lighting device 100 and the light-emitting device 20 will now be described in detail.

As shown in FIG. 2B, the first light-transmissive member 40 of the light-emitting device 20 includes a plurality of particles 43 and a light-transmissive layer 45. The particles 43 and portions of the light-transmissive layer 45 covering at least a portion of the surface of the particles 43 form the protrusions 40a. It is preferred that the protrusions 40a are formed by the particles 43, as it is possible to easily adjust the configuration of the protrusions 40a based on the structure of the particles 43. Therefore, it is possible to easily adjust, based on the structure of the particles 43, the configuration of the gap between the end face 10a of the lightguide panel and the light-emitting device 20. The surface configuration of the protrusions 40a may vary depending on the degree of coverage of the particles 43 by the light-transmissive layer 45. That is, it can be any of the surface of a particle 43, a combination of the surface of a particle 43 and the surface of the light-transmissive layer 45, and the surface of the light-transmissive layer 45. Therefore, the contact portion of a protrusion 40a with the end face 10a of the lightguide panel can be the surface of a particle 43, a combination of the surface of a particle 43 and the surface of the light-transmissive layer 45, or the surface of the light-transmissive layer 45. In an area where the light-transmissive layer 45 covers a particle 43 to form a protrusion 40a, the surface of the light-transmissive layer 45 may be formed so as to conform to or rise onto the particle 43.

The first light-transmissive member 40 as described above can be formed by applying (e.g., spraying, printing or potting) and curing a liquid material (the term "liquid" as used herein includes the slurry form and the solution form) of the light-transmissive layer 45 containing the particles 43 therein on the light-emitting element 30 (in the present embodiment, on a second light-transmissive member 50 to be described later). When a spraying process is used, pulsed spray is particularly preferred as it is easy to control the thickness of the light-transmissive layer 45. The first light-transmissive member 40 can also be formed by applying a sheet, which is molded in advance with a plurality of protrusions 40a, or a small piece thereof on the light-emitting element 30, more specifically, on the second light-transmissive member 50.

The shape of the particles 43 may be chosen appropriately and may be a crushed shape (that is, random shape), but it is preferably substantially spherical as shown in FIG. 2B. When the particles 43 are substantially spherical, it can be easy to form the protrusions 40a, and thus the gap between the protrusions 40a and the end face 10a of the lightguide panel, in a desirable configuration, and it is likely that a stable contact between the protrusions 40a and the end face 10a of the lightguide panel is realized. Moreover, it is possible to reduce contact between the particles 43 and to reduce the aggregation of the particles 43.

The lower limit of the ratio of the mean thickness of the light-transmissive layer 45 with respect to the mean particle size of the particles 43 may be chosen appropriately, and it is preferably 0.1 or more, more preferably 0.15 or more, and even more preferably 0.2 or more, in view of the anchoring strength of the particles 43 on the light-emitting device 20, i.e., the first light-transmissive member 40. The upper limit of the ratio of the mean thickness of the light-transmissive layer 45 with respect to the mean particle size of the particles 43 may be chosen appropriately, and it is preferably 0.9 or less, more preferably 0.8 or less, and even more preferably 0.7 or less, in order to realize the protrusions 40a of a desirable configuration and thus the gap between the protrusions 40a and the end face 10a of the lightguide panel.

The lower limit of the range of mean particle size of the particles 43 may be chosen appropriately, and it is preferably 1 μm or more, more preferably 2 μm or more, and even more preferably 3 μm or more, in order to realize the protrusions 40a of a desirable configuration and thus the gap between the protrusions 40a and the end face 10a of the lightguide panel. The upper limit of the range of the mean particle size of the particles 43 may be chosen appropriately, and it is preferably 30 μm or less, more preferably 20 μm or less, and even more preferably 15 μm or less, in view of the anchoring strength of the particles 43 on the light-emitting device 20, i.e., the first light-transmissive member 40.

A specific example of the first light-transmissive member 40 has a rectangular shape having a length (length in x direction) of 1.8 mm and a height (length in z direction) of 0.32 mm as seen from the front side, and is composed of the particles 43 of spherical silica beads having a mean particle size of 10 μm, and the light-transmissive layer 45, which is a thin film of a methyl-phenyl silicone resin having a mean thickness of 5 μm.

The mean particle size of the particles 43 can be defined as $D_{50}$. The mean particle size of the particles 43 can be measured by a laser diffraction scattering method, an image analysis method (scanning electron microscopy (SEM), a transmission electron microscopy (TEM)), etc., for example. The particle size measuring device of a laser diffraction scattering method may be one from the SALD line (e.g., SALD-3100) manufactured by Shimadzu Corporation, for example. The image analysis method is in conformity with JIS Z 8827-1:2008, for example.

The lower limit of the range of the volume percent of the particles 43 in the first light-transmissive member 40 may be chosen appropriately, and it is preferably 10% or more, more preferably 15% or more, and even more preferably 20% or more, in order to realize the protrusions 40a of a desirable configuration and thus the gap between the protrusions 40a and the end face 10a of the lightguide panel. The upper limit of the range of the volume percent of the particles 43 in the first light-transmissive member 40 may be chosen appropriately, and it is preferably 90% or less, more preferably 80% or less, and even more preferably 70% or less, in view of the anchoring strength of the particles 43 on the light-emitting device 20, i.e., the first light-transmissive member 40.

The lower limit of the range of the number density of the particles 43 on the surface of the first light-transmissive member 40 may be chosen appropriately, and it is preferably $10/mm^2$ or more, more preferably $50/mm^2$ or more, and even more preferably $100/mm^2$ or more, in order to realize the protrusions 40a of a desirable configuration and thus the gap between the protrusions 40a and the end face 10a of the lightguide panel. The upper limit of the range of the number density of the particles 43 on the surface of the first light-transmissive member 40 may be chosen appropriately, and it is preferably $1000/mm^2$ or less, more preferably $500/mm^2$ or less, and even more preferably $300/mm^2$ or less, in view of the anchoring strength of the particles 43 on the light-emitting device 20, i.e., the first light-transmissive member 40.

The arithmetic mean roughness Ra of the surface having the plurality of protrusions 40a of the first light-transmissive member is preferably 3 μm or more and 30 μm or less, more preferably 5 μm or more and 20 μm or less, and even more preferably 7 μm or more and 15 μm or less, in order to realize the protrusions 40a of a desirable configuration and thus the gap between the protrusions 40a and the end face 10a of the lightguide panel. The Ra measuring device may be one from the 3D shape measurement system VR-3000 line (e.g., VR-3100) manufactured by Keyence Corporation, for example. Ra is in conformity with JIS B0601, for example. Note that the preferred range of Ra similarly applies also to first light-transmissive members 41 and 42 of light-emitting devices 21 and 22 to be described later.

The difference between the refractive index of the particles 43 and the refractive index of the light-transmissive layer 45 is preferably as small as possible in view of the light extraction efficiency of the light-emitting device 20, and specifically it is preferably 0.3 or less, more preferably 0.2 or less, and even more preferably 0.1 or less. The refractive index as used herein is the measured value at a temperature of 25° C. and sodium D line wavelength.

As shown in FIG. 2B, the light-emitting device 20 preferably further includes a second light-transmissive member 50 containing a fluorescent substance 53 between the light-emitting element 30 and the first light-transmissive member 40. Light emitted from the fluorescent substance 53 is more diffusive than light emitted from the light-emitting element 30, and light is likely to leak at the light-receiving edge of the lightguide panel 10 if the light-emitting device 20 includes the second light-transmissive member 50 containing the fluorescent substance 53. This may further enhance the technical significance of the configuration of the present embodiment. The second light-transmissive member 50 and the light-emitting element 30, and the second light-transmissive member 50 and the first light-transmissive member 40 may be attached together via a light-transmissive adhesive member therebetween or may be attached directly to each other.

As shown in FIG. 2B, the light-emitting device 20 preferably includes a light-reflective member 60 covering the circumference of the light-emitting element 30. Then, the light-reflective member 60 reflects light from the light-emitting element 30 toward the optical axis of the light-emitting element 30, i.e., toward the optical axis or the central axis of the light-emitting device 20, thereby making it even less likely that light leaks at the light-receiving edge of the lightguide panel 10.

The term "circumference" as used herein refers to the complete circumference of the member to be covered as seen from the front side, i.e., the entire side surface. The term "to cover" refers not only to a case in which the member to be covered is in contact with the light-reflective member 60, but also to a case in which there is another member, such as a light-transmissive adhesive member, interposed therebetween. The light-reflective member 60 may cover at least a portion of the side surface of the member to be covered, but the light-reflective member 60 covers preferably 50% or more, more preferably 75% or more, even more preferably 90% or more, and most preferably all, of the total area of the entire side surface of the member to be covered.

Figure 3A:
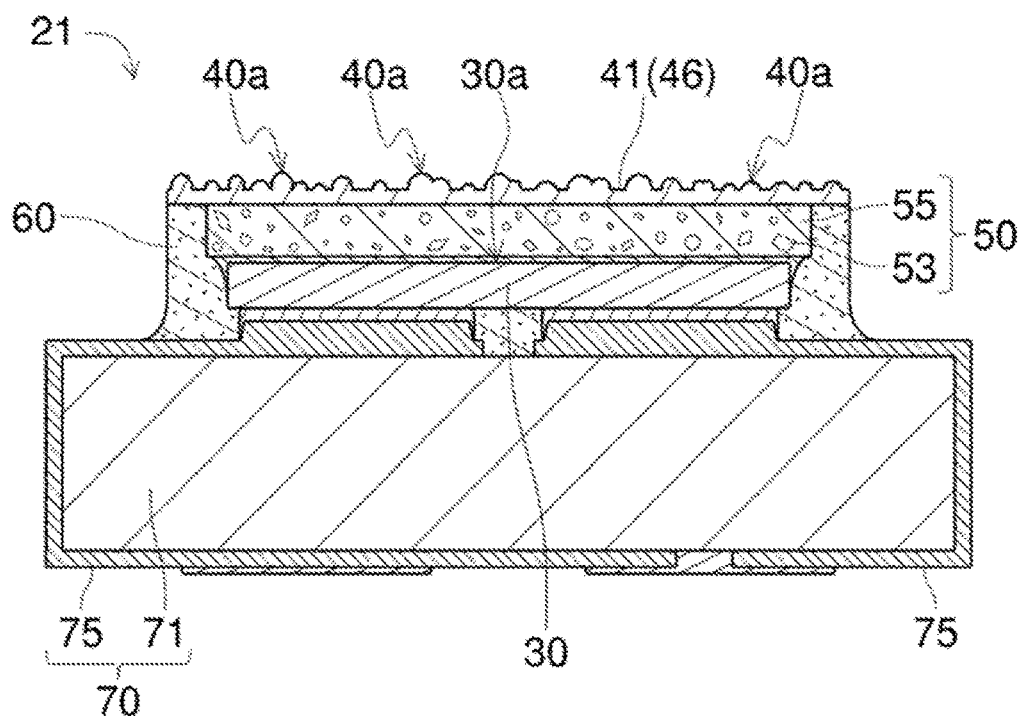
FIG. 3A is a schematic cross-sectional view showing a variation of the light-emitting device according to an embodiment of the present disclosure.

FIG. 3A is a schematic cross-sectional view showing a variation of the light-emitting device 20. The light-emitting device 21 shown in FIG. 3A is different from the light-emitting device 20 in terms of the configuration of the protrusions 40a of the first light-transmissive member and the configuration of the coverage of the light-reflective member 60, but is otherwise substantially the same as the light-emitting device 20.

As shown in FIG. 3A, the first light-transmissive member 41 of the light-emitting device 21 is a light-transmissive layer 46. The protrusions 40a of the first light-transmissive member are bumps of the surface of the light-transmissive layer 46. The protrusions 40a are an example of protrusions not dependent on the particles 43.

The first light-transmissive member 41 as described above can be formed by spraying and curing a liquid material (the term "liquid" as used herein includes the slurry form and the solution form) of the light-transmissive layer 46 whose viscosity or thixotropy has been adjusted, for example. That is, each protrusion 40a is a part of the surface of one droplet (particle) or a part of the surface of a collection of droplets (particles) of the sprayed liquid material that remains in a protruding shape on the surface of the light-transmissive layer 46. In such a case, the surface of the protrusion 40a is often a projecting curved surface. When the spraying process is used, pulsed spray is particularly preferred because it is easy to form the protrusions 40a. Alternatively, this first light-transmissive member 41 can also be formed by applying a sheet, which is molded in advance with a plurality of protrusions 40a, or a small piece thereof on the light-emitting element 30 (the second light-transmissive member 50 and the light-reflective member 60 in this variation). In such a case, using a mold, or the like, the protrusions 40a can be formed regularly. Exemplary regular arrangements of the protrusions 40a include a parallel arrangement, a staggered arrangement, etc.

As shown in FIG. 3A, the light-reflective member 60 of the light-emitting device 21 further covers the circumference of the second light-transmissive member 50, in addition to the circumference of the light-emitting element 30. Then, the light-reflective member 60 can also reflect light emitted from the fluorescent substance 53 in the second light-transmissive member 50, in addition to light from the light-emitting element 30, toward the optical axis (e.g., the central axis) of the light-emitting device 21, thereby making it even less likely that light leaks at the light-receiving edge of the lightguide panel 10.

Figure 3B:
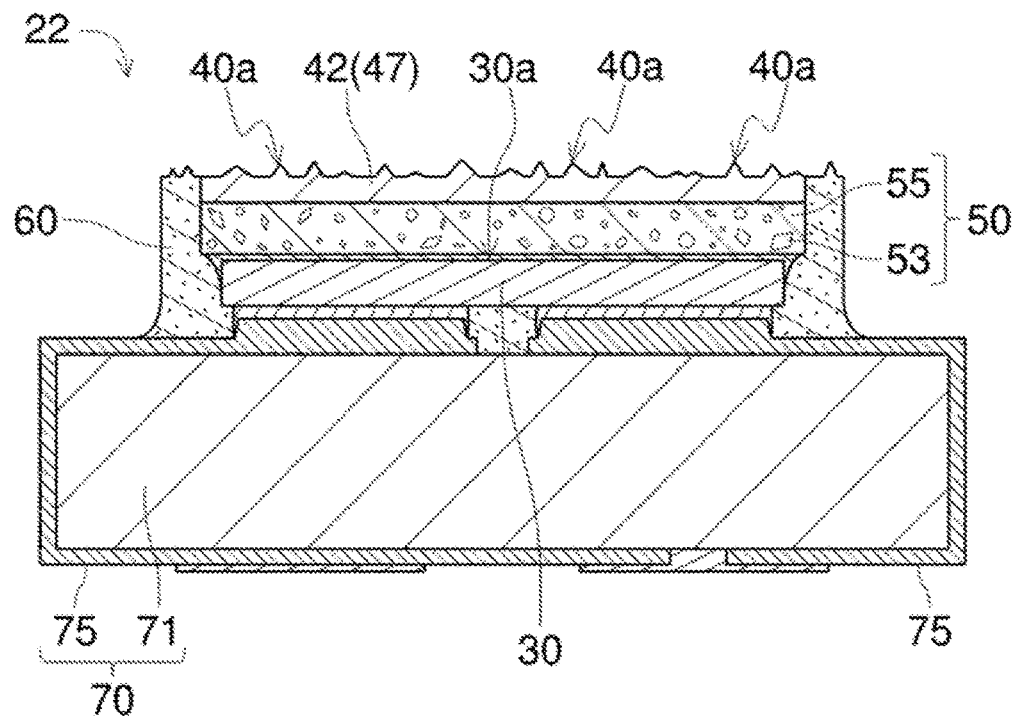
FIG. 3B is a schematic cross-sectional view showing a variation of the light-emitting device according to an embodiment of the present disclosure.

FIG. 3B is a schematic cross-sectional view showing another variation of the light-emitting device 20. The light-emitting device 22 shown in FIG. 3B is different from the light-emitting device 20 in terms of the configuration of the protrusions 40a of the first light-transmissive member and the configuration of the coverage of the light-reflective member 60, but is otherwise substantially the same as the light-emitting device 20.

As shown in FIG. 3B, the first light-transmissive member 42 of the light-emitting device 22 is also composed of a light-transmissive layer 47. The protrusions 40a of the first light-transmissive member are bumps of the surface of the light-transmissive layer 47. The protrusions 40a are also an example of protrusions not dependent on the particles 43. Protrusions similar to the protrusions 40a of the first light-transmissive member are also formed on the surface of the second light-transmissive member 50.

The first light-transmissive member 42 as described above can be formed by partially chipping the surface of the cured light-transmissive layer 47 by grinding or sandblasting, for example. In such a case, the surface of the protrusions 40a may be either a pointed projecting surface or a projecting curved surface.

As shown in FIG. 3B, the light-reflective member 60 of the light-emitting device 22 further covers the circumference of the first light-transmissive member 42, in addition to the circumference of the light-emitting element 30 and the circumference of the second light-transmissive member 50. Thus, light leaking from the side surface of the first light-transmissive member 42 can be reflected by the light-reflective member 60 toward the optical axis (e.g., the central axis) of the light-emitting device 22, thereby making it even less likely that light leaks at the light-receiving edge of the lightguide panel 10.

The components of the lighting device 100 according to the present embodiment will now be described.

Lightguide Plate 10

The lightguide panel 10 is a light-transmissive plate-like member. The end face 10a of the lightguide panel 10 is the light-receiving surface, and one of the plate surfaces is the light-emitting surface. An area of the end face 10a of the lightguide panel that opposes the light-emitting device 20 is preferably flat, but depressions and protrusions may be formed thereon. The thickness of the lightguide panel 10 may be uniform across the entire area, but the thickness may vary partially, e.g., the thickness may gradually decrease away from the light-emitting device 20, or the light-receiving edge may gradually become thicker starting from the main part. The base material of the lightguide panel 10 may be any material through which light output from the light-emitting device 20 can pass (the transmittance is preferably 85% or more). Specifically, the material may be an acrylic resin, a polycarbonate resin, a PMMA resin, a polynorbornene resin, a polystyrene resin, a glass, or the like.

Light-Emitting Device 20, 21, 22

The light-emitting device 20, 21, 22 is a light source that emits light to be incident upon the lightguide panel 10. The light-emitting device 20, 21, 22 may be a chip size package (CSP)-type light-emitting device that does not include the wiring substrate 70, but instead includes, as external connection terminals, positive and negative electrodes of the light-emitting element 30 or projecting electrodes (for example, bumps, pillars, etc.) attached to the positive and negative electrodes. The light-emitting device 20, 21, 22 is not limited to the side-emitting type, but may be applied to a top-emitting type or a "top-view type".

Light-Emitting Element 30

The light-emitting element 30 at least includes a semiconductor device structure, and in many cases further includes a substrate. The light-emitting element 30 may be an LED chip, for example. The shape of the light-emitting surface 30a of the light-emitting element is preferably a rectangular shape, particularly an oblong rectangular shape that is elongated in one direction (for example, the x direction in FIG. 2A). The side surface of the light-emitting element 30, mainly the substrate of the light-emitting element, may be perpendicular to the light-emitting surface 30a or may be inclined inward or outward. Although the light-emitting element 30 preferably includes a positive and a negative electrode on the same surface, but may use an opposing electrode structure in which the positive and negative electrodes are provided on opposite sides. The light-emitting surface 30a of the light-emitting element can be defined as a surface that faces the end face 10a of the lightguide panel. That is, when the light-emitting element 30 is of a flip-chip mount type, the light-emitting surface 30a is a surface that is opposite from the surface on which the positive and negative electrodes are provided. On the other hand, when the light-emitting element 30 is of an opposing electrode structure or a face-up mount-type, the light-emitting surface 30a is an electrode provision surface to which wires are connected. The number of light-emitting elements 30 to be mounted on one light-emitting device 20, 21, 22 may be one or more. A plurality of light-emitting elements 30 may be connected in series or in parallel. The semiconductor device structure is preferably a layered structure of semiconductor layers, i.e., a structure at least including an n-type semiconductor layer and a p-type semiconductor layer with an active layer interposed therebetween. The semiconductor device structure may include a positive and a negative electrode and/or an insulative film. The positive and negative electrodes may be formed of gold, silver, tin, platinum, rhodium, titanium, aluminum, tungsten, palladium, nickel, or an alloy thereof. The insulative film may be formed of an oxide or a nitride of at least one element selected from the group consisting of silicon, titanium, zirconium, niobium, tantalum and aluminum. The emission wavelength of the light-emitting element 30 can be selected from the ultraviolet region to the infrared region depending on the semiconductor material and the crystal mix ratio thereof. The semiconductor material is preferably nitride semiconductor (expressed primarily by the general formula $In_xAl_yGa_{1-x-y}N$ ($0 \leq x$, $0 \leq y$, $x+y \leq 1$)), which is a material capable of emitting light of a short wavelength that can efficiently excite the fluorescent substance 53. The emission wavelength (peak wavelength) of the light-emitting element 30 is preferably 400 nm or more and 530 nm or less, more preferably 420 nm or more and 490 nm or less, and even more preferably 450 nm or more and 475 nm or less in view of the emission efficiency, the excitation of the fluorescent substance 53, and the color mixture with the light emitted from the fluorescent substance 53, etc. Moreover, an InAlGaAs-based semiconductor, an InAlGaP-based semiconductor, zinc sulfide, zinc selenide, silicon carbide, etc., may also be used. The substrate of the light-emitting element 30 is a crystal growth substrate on which crystals of semiconductors of the semiconductor device structure can primarily be grown, but it may be an attachment substrate to which a semiconductor device structure separated from a crystal growth substrate is attached. As the substrate is light-transmissive, it can be easy to employ a flip-chip mount and it can be easy to increase the light extraction efficiency. The base material of the substrate may be sapphire, spinel, gallium nitride, aluminum nitride, silicon, silicon carbide, gallium arsenide, gallium phosphide, indium phosphide, zinc sulfide, zinc oxide, zinc selenide, diamond, etc. Among others, sapphire is preferred. Alternatively, the light-emitting element 30 may not include any substrate.

First Light-Transmissive Member 40, 41, 42

The surface of the first light-transmissive member 40, 41, 42 constitutes the outermost surface of the light-emitting device 20, 21, 22, and forms the light-emitting area through which the light from the light-emitting element 30 (also the light from the fluorescent substance 53 if the second light-transmissive member 50 is present) is output to the outside of the light-emitting device 20, 21, 22. The first light-transmissive member 40, 41, 42 preferably does not substantially contain a fluorescent substance in order to protect the fluorescent substance. Note that "to not substantially contain" as used herein refers not only to cases in which the substance is not contained at all, but also to cases in which the "content" is such that it does not affect the emission chromaticity of the light-emitting device 20, 21, 22.

Particles 43

The particles 43 may be an inorganic substance or an organic substance. The particles 43 of an inorganic substance are desirable in terms of the heat resistance and the light resistance, and have a relatively high thermal conductivity. Specifically, the inorganic substance is preferably an oxide or a nitride of any element selected from silicon, aluminum, zirconium, titanium, zinc, magnesium, gallium, tantalum, niobium, bismuth, yttrium, iridium, indium, tin and hafnium. An oxide is particularly preferable, and among others, silicon oxide, aluminum oxide, zirconium oxide and titanium oxide are readily available and less expensive. The particles 43 of an organic substance has less optical influence because the refractive index thereof can be matched to that of the light-transmissive layer 45 through copolymerization, etc. Specifically, the organic substance is preferably selected from polymethacrylic acid ester and a copolymer thereof, polyacrylic acid ester and a copolymer thereof, cross-linked polymethacrylic acid ester, cross-linked polyacrylic acid ester, polystyrene and a copolymer thereof, cross-linked polystyrene, an epoxy resin, a silicone resin, an amorphous fluorine resin or a modified resin thereof, etc.

Light-Transmissive Layer 45, 46, 47

A material for the base material of the light-transmissive layer 45, 46, 47 can be any as long as it is light-transmissive for light that is output from the light-emitting element 30 (e.g., with an optical transmittance of 50% or more, preferably 70% or more, and more preferably 85% or more). The base material of the light-transmissive layer 45, 46, 47 may be a resin, e.g., a silicone resin, an epoxy resin, a phenolic resin, a polycarbonate resin, an acrylic resin, or a modified resin thereof. Among others, a silicone resin or a modified resin thereof is preferred for their desirable heat resistance and light resistance. More specific examples of a silicone resin include a dimethyl silicone resin, a methyl-phenyl silicone resin and a diphenyl silicone resin. Alternatively, it may be a glass. The light-transmissive layer 45, 46, 47 may contain, in the base material, nanoparticles (e.g., particles whose mean particle size is 1 nm or more and 50 nm or less) of silica, or the like, as a filler for adjusting viscosity or giving thixotropy, etc. The light-transmissive layer 45 of the first light-transmissive member 40 containing the particles 43 can serve also as a binder for binding the particles 43. As the refractive index of the light-transmissive layer 45, 46, 47 and/or the particles 43 is lower than the refractive index of a binder layer 55 of the second light-transmissive member, it is likely that a high light extraction efficiency is realized.

Second Light-Transmissive Member 50

The second light-transmissive member 50 can serve as a wavelength conversion member. The shape of the second light-transmissive member 50 as seen from the front side is preferably a rectangular shape, particularly an oblong rectangular shape that is elongated in one direction (the x direction in FIG. 2A) so as to be similar to the shape of the light-emitting surface 30a of the light-emitting element. The second light-transmissive member 50 may be a molded member having a plate shape or a small piece cut from a sheet. In the present embodiment, the second light-transmissive member 50 includes the fluorescent substance 53 and the binder layer 55 for binding the fluorescent substance 53. Alternatively, the second light-transmissive member 50 may be a member obtained by sintering together the fluorescent substance 53 and an inorganic substance (e.g., alumina), or a plate like crystal of the fluorescent substance 53, etc. Note that when the color of the light emitted from the light-emitting element 30 is used as the color of the light emitted from the light-emitting device, the second light-transmissive member 50 may be omitted.

Fluorescent Substance 53

The fluorescent substance 53 absorbs at least a portion of primary light output from the light-emitting element 30 to output secondary light whose wavelength is different from that of the primary light. Specifically, it may be a yttrium aluminum garnet-based phosphor (e.g., $Y_3(Al,Ga)_5O_{12}$:Ce), a lutetium aluminum garnet-based phosphor (e.g., $Lu_3(Al,Ga)_5O_{12}$:Ce), a silicate-based phosphor (e.g., $(Ba,Sr)_2SiO_4$:Eu), a chlorosilicate-based phosphor (e.g., $Ca_8Mg(SiO_4)_4Cl_2$:Eu), a β SIALON-based phosphor (e.g., $Si_{6-Z}Al_ZO_ZN_{8-z}$:Eu($0<Z<4.2$)), a nitrogen-containing calcium aluminosilicate (CASN or SCASN)-based phosphor (e.g., (Sr,Ca)$AlSiN_3$:Eu), a potassium fluorosilicate-based phosphor (e.g., $K_2SiF_6$:Mn), etc. Alternatively, the fluorescent substance 53 may contain quantum dots. Quantum dots are particles whose particle size is about 1 nm or more and about 100 nm or less, and the emission wavelength can be varied based on the particle size. For example, the material of the quantum dots may be cadmium selenide, cadmium telluride, zinc sulfide, cadmium sulfide, lead sulfide, lead selenide or cadmium telluride/mercury, etc. The fluorescent substance 53 may use any of these materials alone, or may use two or more of these in combination. When the second light-transmissive member 50 includes two or more fluorescent substances 53, it may be a single layer containing a plurality of fluorescent substances 53, or may be a layered structure including a plurality of layers each containing one fluorescent substance 53.

Binder Layer 55

The binder layer 55 may be composed of the same material as that of the light-transmissive layer 45, 46, 47.

Light-Reflective Member 60

The base material of the light-reflective member 60 may be a resin, e.g., a silicone resin, an epoxy resin, a phenolic resin, a polycarbonate resin, an acrylic resin, or a modified resin thereof. Among others, a silicone resin or a modified resin thereof is preferred for their desirable heat resistance and light resistance. More specific examples of a silicone resin include a dimethyl silicone resin, a methyl-phenyl silicone resin and a diphenyl silicone resin. Alternatively, it may be a glass. The light-reflective member 60 preferably contains a white pigment in the base material. The white pigment may be one selected from titanium oxide, zinc oxide, magnesium oxide, magnesium carbonate, magnesium hydroxide, calcium carbonate, calcium hydroxide, calcium silicate, magnesium silicate, barium titanate, barium sulfate, aluminum hydroxide, aluminum oxide and zirconium oxide, or a combination of two or more thereof. The shape of the white pigment may be chosen appropriately and may be a crushed shape (that is, random shape), but it is preferably substantially spherical in view of fluidity. The particle size (e.g., defined as $D_{50}$) of the white pigment may be about 0.1 µm or more and about 0.5 µm or less, for example. The content of the white pigment in the light-reflective member 60 may be chosen appropriately, and it is preferably 10 wt % or more and 70 wt % or less, and more preferably 30 wt % or more and 60 wt % or less, for example, in view of the optical reflectivity and the viscosity in a fluid state. In the present specification, "wt %" refers to percent by weight, meaning the percentage of the weight of the white pigment with respect to the total weight of the light-reflective member 60.

Wiring Substrate 70, Circuit Board 80

Specifically, the wiring substrate 70 can be composed of the base 71 and the conductive interconnect 75 as will be described below. The circuit board 80, as a circuit interconnect, may replace the conductive wiring 75 of the wiring substrate 70, and may be formed of the same material as the wiring substrate 70. The wiring substrate 70 is preferably a rigid substrate in view of the rigidity of the light-emitting device 20, 21, 22. The circuit board 80 is preferably a flexible substrate in view of the thinness of the lighting device 100. The wiring substrate 70 and the circuit board 80 may include a protective film such as a solder resist or a coverlay, as necessary.

Base 71

In the case where the substrate is rigid, the base 71 may be formed of resin (including fiber reinforced resin) ceramics, glass, metal, paper, etc. The resin may be epoxy, glass epoxy, bismaleimide triazine (BT), polyimide, etc. The ceramics may be aluminum oxide, aluminum nitride, zirconium oxide, zirconium nitride, titanium oxide, titanium nitride, or a mixture thereof, etc. The metal may be copper, iron, nickel, chromium, aluminum, silver, gold, titanium, or an alloy thereof. In the case where the substrate is flexible, the base 71 may be formed of polyimide, polyethylene terephthalate, polyethylene naphthalate, liquid crystal polymer, cyclo-olefin polymer, etc.

Conductive Wiring 75

The conductive wiring 75 is formed at least on the front surface of the base 71, and may also be formed on the inner side and/or the side surface and/or the rear surface (back surface) of the base 71. The conductive wiring 75 preferably includes an element mount portion (land portion) on which the light-emitting element 30 is mounted, an external connection terminal portion, a lead wire portion for connecting these portions together, etc. The conductive wiring 75 may be formed of copper, iron, nickel, tungsten, chromium, aluminum, silver, gold, titanium, palladium, rhodium, or an alloy thereof. It may be a single layer or multiple layers of these metals or alloys. Particularly, copper or a copper alloy is preferred in view of the heat radiation. In view of the wettability and/or the optical reflectivity of the attachment member 90, a layer of silver, platinum, aluminum, rhodium, gold or an alloy thereof, etc., may be provided on the surface layer of the conductive wiring 75.

Attachment Member 90

The attachment member 90 may be any of various solders. Specifically, it may be a tin-bismuth-based solder, a tin-copper-based solder, a tin-silver-based solder, a gold-tin-based solder, etc. For example, the attachment member 90 is in a paste form before being heated, melts when heated, and solidifies when cooled thereafter.

The lighting device according to one embodiment of the present disclosure can be used as an image reading unit of a scanner, or the like, as well as a backlight unit of a liquid crystal display and various types of lighting equipment. The light-emitting device according to one embodiment of the present disclosure is suitable for applications in which the surface of the first light-transmissive member is positioned to be in contact with the end face of the lightguide panel.

While the present invention has been described with respect to exemplary embodiments thereof, it will be apparent to those skilled in the art that the disclosed invention may be modified in numerous ways and may assume many embodiments other than those specifically described above. Accordingly, it is intended by the appended claims to cover all modifications of the invention that fall within the true spirit and scope of the invention.

What is claimed is:

1. A lighting device comprising:
   a lightguide panel having an end face that is a light-receiving surface; and
   a light-emitting device that emits light toward the end face of the lightguide panel, the light-emitting device including:
   a light-emitting element; and
   a first light-transmissive member located between the end face of the lightguide panel and the light-emitting element, the first light-transmissive member having a plurality of protrusions on a surface thereof, wherein
   at least one of the plurality of protrusions is in direct contact with the end face of the lightguide panel.

2. The lighting device according to claim 1, wherein: the first light-transmissive member includes a plurality of particles and a light-transmissive layer; and the protrusions is formed with at least a portion of a surface of each particle covered by the light-transmissive member.

3. The lighting device according to claim 2, wherein the particles each have a spherical shape.

4. The lighting device according to claim 2, wherein a ratio of a mean thickness of the light-transmissive layer with respect to a mean particle size of the particles is 0.1 or more and 0.9 or less.

5. The lighting device according to claim 2, wherein a mean particle size of the particles is 1 µm or more and 30 µm or less.

6. The lighting device according to claim 2, wherein a volume percent of the particles in the first light-transmissive member is 10% or more and 90% or less.

7. The lighting device according to claim 2, wherein a number density of the particles on a surface of the first light-transmissive member is 10/mm$^2$ or more and 1000/mm$^2$ or less.

8. The lighting device according to claim 1, wherein the light-emitting device further includes a second light-transmissive member containing a fluorescent substance between the light-emitting element and the first light-transmissive member.

9. The lighting device according to claim 8, wherein the second light-transmissive member has a thickness greater than the first light-transmissive member.

10. The lighting device according to claim 8, further comprising an adhesive member located between the light-emitting element and the second light-transmissive member, wherein the adhesive member covers at least a portion of a side surface of the light-emitting element.

11. The lighting device according to claim 1, wherein the light-emitting device includes a light-reflective member covering a circumference of the light-emitting element.

12. The lighting device according to claim 1, wherein:
the first light-transmissive member includes a plurality of particles and a light-transmissive layer; and
the light-transmissive layer is made of silicone resin.

13. The lighting device according to claim 1, further comprising a wiring substrate, wherein the light-emitting element is mounted on the wiring substrate.

14. The lighting device according to claim 1, wherein the light-emitting element includes projecting electrodes as external connection terminals.

15. The lighting device according to claim 1, wherein the end face of the lightguide panel has a greater width in a height direction than a width of the surface of the first light-transmissive member which faces the end face of the lightguide panel.

16. The lighting device according to claim 1, wherein the light-emitting device further comprises a light-reflective member, and a second light-transmissive member between the light-emitting element and the first light-transmissive member, and wherein the light-reflective member covers a circumference of the first light-transmissive member.

* * * * *